(12) United States Patent
Xue

(10) Patent No.: US 9,735,386 B2
(45) Date of Patent: Aug. 15, 2017

(54) QUANTUM-DOT BASED HYBRID LED LIGHTING DEVICES

(71) Applicant: University of Florida Research Foundation, Inc., Gainesville, FL (US)

(72) Inventor: Jiangeng Xue, Gainesville, FL (US)

(73) Assignee: UNIVERSITY OF FLORIDA RESEARCH FOUNDATION, INC., Gainesville, FL (US)

(*) Notice: Subject to any disclaimer, the term of this patent is extended or adjusted under 35 U.S.C. 154(b) by 0 days.

(21) Appl. No.: 14/774,817

(22) PCT Filed: Mar. 11, 2014

(86) PCT No.: PCT/US2014/023330
§ 371 (c)(1),
(2) Date: Sep. 11, 2015

(87) PCT Pub. No.: WO2014/164726
PCT Pub. Date: Oct. 9, 2014

(65) Prior Publication Data
US 2016/0028036 A1    Jan. 28, 2016

Related U.S. Application Data

(60) Provisional application No. 61/776,219, filed on Mar. 11, 2013.

(51) Int. Cl.
*H01L 51/50* (2006.01)
*H01L 51/52* (2006.01)

(52) U.S. Cl.
CPC ...... *H01L 51/5036* (2013.01); *H01L 51/5275* (2013.01); *H01L 51/5016* (2013.01); *H01L 2251/303* (2013.01); *H01L 2251/5369* (2013.01)

(58) Field of Classification Search
CPC ..... H01L 51/50; H01L 51/52; H01L 51/5012; H01L 51/5028; H01L 51/0069;
(Continued)

(56) References Cited

U.S. PATENT DOCUMENTS 7,957,621 B2    6/2011  Zhang et al.
8,040,058 B2   10/2011  Douglas et al.
(Continued)

FOREIGN PATENT DOCUMENTS

KR     2006-0018583         3/2006
WO   WO 2012024582 A2 *   2/2012 ............... F21V 7/22

OTHER PUBLICATIONS

Chandramohan, S. et al., "Trap-state-assisted white light emission from a CdSe nanocrystal integrated hybrid light-emitting diode," *Optics Letters*, Mar. 15, 2011, pp. 802-804, vol. 36, No. 6.
(Continued)

*Primary Examiner* — Chuong A Luu
*Assistant Examiner* — Rodolfo D Fortich
(74) *Attorney, Agent, or Firm* — Saliwanchik, Lloyd & Eisenschenk

(57) ABSTRACT

A white light source is a hybrid organic light emitting diode (OLED) device having an electroluminescent layer including a blue emitting organic phosphor or a combination of a green emitting organic phosphor with a blue emitting phosphor and a conversion layer including photoluminescent quantum dots (QDs) at or near the light exiting face of the hybrid OLED. The QDs down-convert a portion of the blue or blue and green light to higher wavelengths of visible light, where the combination of wavelengths exiting the device provides white light. The QDs can be within an array of microlenses on the light exiting surface of the hybrid OLED to enhance the efficiency of light emission from the electrically excited phosphors and the down-conversion QDs.

11 Claims, 3 Drawing Sheets

(58) Field of Classification Search
CPC .............. H01L 51/008; H01L 51/0087; H01L 51/5004; H01L 51/5092; H01L 51/5215; H01L 51/5262; H01L 51/5275; H01L 51/5284
USPC .................................. 257/40, 13, 88, 89, 98
See application file for complete search history.

(56) References Cited

U.S. PATENT DOCUMENTS

| | | | |
|---|---|---|---|
| 8,373,341 | B2 | 2/2013 | Xue et al. |
| 2008/0278063 | A1 | 11/2008 | Cok |
| 2008/0297028 | A1 | 12/2008 | Kane et al. |
| 2010/0283036 | A1* | 11/2010 | Coe-Sullivan ....... H05B 33/145 257/13 |
| 2010/0289044 | A1 | 11/2010 | Krames et al. |
| 2011/0095271 | A1 | 4/2011 | Bradley et al. |
| 2011/0101387 | A1* | 5/2011 | Kinomoto .............. C09K 11/62 257/89 |
| 2011/0182056 | A1 | 7/2011 | Trottier et al. |
| 2012/0112165 | A1* | 5/2012 | Charlton ........... H01L 27/14603 257/21 |
| 2012/0138894 | A1 | 6/2012 | Qian et al. |

OTHER PUBLICATIONS

Chang, C-H. et al., "Efficient phosphorescent white OLEDs with high color rendering capability," *Organic Electronics*, 2010, pp. 412-418, vol. 11.

Chopra, N. et al., "High efficiency blue phosphorescent organic light emitting device," *Applied Physics Letters*, 2008, pp. 143307 (1-3), vol. 93.

Chopra, N. et al., "High efficiency blue phosphorescent organic light emitting diodes," *Proc. Of SPIE*, 2009, pp. 741512 (1-6), vol. 7415.

Eom, S-H. et al., "Low voltage and very high efficiency deep-blue phosphorescent organic light-emitting devices," *Applied Physics Letters*, 2008, pp. 133309 (1-3), vol. 93.

Eom, S-H. et al., "White phosphorescent organic light-emitting devices with dual triple doped emissive layers," *Applied Physics Letters*, 2009, pp. 153303 (1-3), vol. 94.

Eom, S-H., et al., "Effect of electron injection and transport materials on efficiency of deep-blue phosphorescent organic light-emitting devices," *Organic Electronics*, 2009, pp. 686-691, vol. 10.

Eom, S-H., et al., "Enhancing light extraction in organic light-emitting devices via hemispherical microlens arrays fabricated by soft lithography," *Journal of Photonics for Energy*, 2011, pp. 011002 (1-11), vol. 1.

Eom, S-H., et al., "Close-packed hemispherical microlens arrays for light extraction enhancement in organic light-emitting devices," *Organic Electronics*, 2011, pp. 472-476, vol. 12.

Lee, J. etal., "Effects of triplet energies and transporting properties of carrier transporting materials on blue phosphorescent organic light emitting devices," *Applied Physics Letters*, 2008, pp. 123306 (1-3), vol. 93.

Nizamoglu, S. et al., "White light generation by resonant nonradiative energy transfer from epitaxial InGaN/GaN quantum wells to colloidal CdSe/ZnS core/shell quantum dots," *New Journal of Physics*, 2008, pp. 123001 (1-10), vol. 10.

Wrzesniewski, E. et al., "Enhancing Light Extraction in Top-Emitting Organic Light-Emitting Devices Using Molded Transparent Polymer Microlens Arrays," *Small*, 2012, pp. 2647-2651, vol. 8, No. 17.

Zhang, F. et al., "Solution-processed blue-green organic light-emitting diodes based on cationic iridium complexes with 1-pyridyl-3-methylimidazolin-2-ylidene-C,$C^2$ as the ancillary ligand," *Organic Electronics*, 2012, pp. 1277-1288, vol. 13.

Xue, J. et al., "High efficiency deep-blue and white phosphorescent OLEDs," *Proc. Of SPIE*, 2009, pp. 741511 (1-10), vol. 7415.

Zhu, Y-C. et al., "Highly Efficient Green and Blue-Green Phosphorescent OLEDs Based on Iridium Complexes with the Tetraphenylimidodiphosphinate Ligand," *Adv. Mater.*, 2011, pp. 4041-4046, vol. 23.

* cited by examiner

QUANTUM-DOT BASED HYBRID LED LIGHTING DEVICES

CROSS-REFERENCE TO RELATED APPLICATIONS

This application is the U.S. national stage application of International patent application No. PCT/US2014/023330, filed Mar. 11, 2014, which claims the benefit of U.S. Provisional Application Ser. No. 61/776,219, filed Mar. 11, 2013, the disclosures of which are hereby incorporated by reference in their entireties, including any figures, tables, or drawings.

BACKGROUND OF INVENTION

Light-emitting diodes (LEDs) are increasingly used in modern display technologies. Extension to solid-state lighting (SSL) based on LEDs promises significant advantages over conventional lighting sources such as incandescent and fluorescent lights, while at the same time presenting fewer environmental issues and offering unique lighting design opportunities. LEDs' advantages over traditional light sources include low energy consumption, long lifetime, robustness, small size and fast switching. However, LEDs remain relatively expensive and require precise current and heat management relative to traditional light sources. Fabrication costs are significant and exceed the material costs for some LEDs.

SSL development has focused on LED devices from either inorganic or organic semiconductors, referred to as conventional LEDs or organic light-emitting diodes (OLEDs), respectively. Conventional LEDs are from AlGaAs (red), AlGaInP (orange-yellow-green), and AlGaInN (green-blue), which emit monochromatic light of a frequency corresponding to the band gap of the semiconductor compound used. These conventional LEDs do not emit light of mixed colors, for example, white light. White LEDs can be used as light sources and are capable of producing full color displays with existing color filter technology. One method to produce white light is to combine individual LEDs that simultaneously emit the three primary colors, which mix to produce white light. Another method to produce white light is to use a yellow phosphor to convert monochromatic blue light, or two or more phosphors emitting different colors with blue or UV light. Although LED to broad-spectrum white light is possible in this manner, color control is limited.

Conventional LED technology is considerably more mature than OLEDs; however, the low potential cost of producing OLED panels using high throughput roll-to-toll processes makes OLED technology very attractive for SSL applications. State of the art LED devices that are "warm" white, which is common of incandescent lighting, are considerably lower in efficacy than those that are "cool" white, which is common of florescent lighting. OLEDs are more conducive to achieving "warm" whites. Combination with other potential advantages, such as, ease of thermal management, compatibility with flexible substrates, and fabrication of transparent devices; has allowed OLED technology to receive significant R&D investment. Although OLEDs can also be fabricated relatively inexpensively and provide a variety of colors and "warm" white light, OLEDs generally suffer from deficiencies in efficiency and lifetime relative to LEDs because of the organic material. The relatively high current density and driving voltage required to achieve high luminance promote degradation of the OLEDs, especially in the presence of oxygen, water and UV photons.

Significant increases in OLED device performance and color quality are required to achieve and exceed the DOE SSL 2015 Multi-year Program Goals of 125 lm/W performance with a Color Rendering Index (CRI) quality of above 90. Light extraction is a significant issue for OLEDs, as only 30-40% of the light emission generated in the OLED emissive region can escape the device in the forward viewing direction even when employing state-of-the-art light extraction enhancement methods. Typically, organic molecules provide relatively broad emissions, with spectral full-width-at-half-maximum (FWHM) values typically ranging from 70 to 100 nm. Presently, to achieve a CRI in excess of 90, an appreciable amount of red emissions, at wavelengths approaching 700 nm, is required. Therefore, achieving a broad-spectrum white light source from OLEDs in an efficient manner remains a desirable target.

BRIEF SUMMARY

Embodiments of the invention are directed to a hybrid organic light emitting diode (OLED) device where an electroluminescent layer includes a blue emitting organic emitter or a combination of a green emitting organic emitter with the blue emitting organic emitter and a conversion layer that contains photoluminescent quantum dots (QDs) at or near the light exiting face of the hybrid OLED. The QDs are of a quantity and density to down-convert a portion of the blue and green light to one or more higher wavelengths of visible light such that white light is emitted from the hybrid OLED. In an embodiment of the invention, different QDs are dispersed in an optical resin, which can also include transparent oxide nanoparticles. The QDs can differ in size. The QDs can be included to luminesce with red, orange and/or yellow color. The conversion layer can be in the form of an array of microlenses residing on the light exiting face of the hybrid OLED.

DETAILED DISCLOSURE

Figure 1:
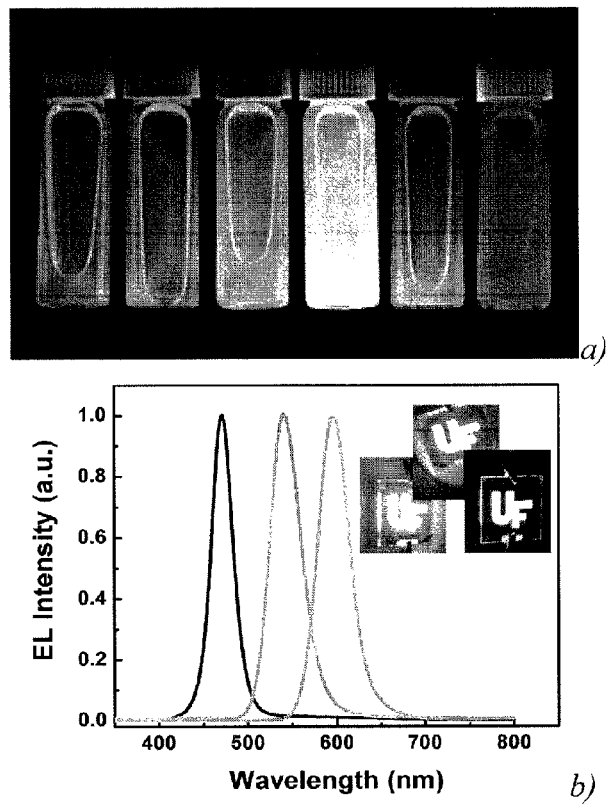
FIG. 1 shows a) a photograph of vials containing fluorescing QD solutions where the size of the QDs were controlled to produce a variety of colors of the visible spectrum from blue (left) through red (right); and b) superimposed electroluminescence spectra from three multilayer LEDs employing three different tuned fluorescent QDs, where the individual LEDs (shown photographically in the insert) emit different colors.

Embodiments of the invention are directed to hybrid organic light emitting diode (OLED) devices that render a "warm" white light by employing a blue or a blue-green OLED with a plurality of different quantum dots (QDs) that function as down-conversion emitters to convert the smaller wavelength visible light to the broad spectrum emission needed for providing white light. QDs are nanocrystals of inorganic semiconductors whose band gap and emission wavelength depends on the size of the QDs due to the quantum confinement effect. Advanced colloidal QD synthesis methods have led to tunable colors, as illustrated in FIG. 1a, throughout the visible region of the electromagnetic spectrum with high luminescence quantum yields of up to 90% and narrow FWHMs of 20-30 nm. High efficiency, multilayer LEDs using QDs as the emitting layer have been prepared, as illustrated in FIG. 1b. Many fluorescent QDs, such as those shown in FIG. 1, can be employed in the hybrid OLEDs according to embodiments of the invention as down-conversion emitters. It should be understood that the down-conversion by the QDs can occur by any photoluminescence process, including a fluorescence process, a phosphorescence process, or a combination of fluorescence and phosphorescence, and that the use of the term fluorescence with the QDs is for convenience to differentiate between the electroluminescence process, which is usually, but not necessarily, a phosphorescence process, from the down-conversion process, which typically appears to be a fluorescence process.

Figure 2:
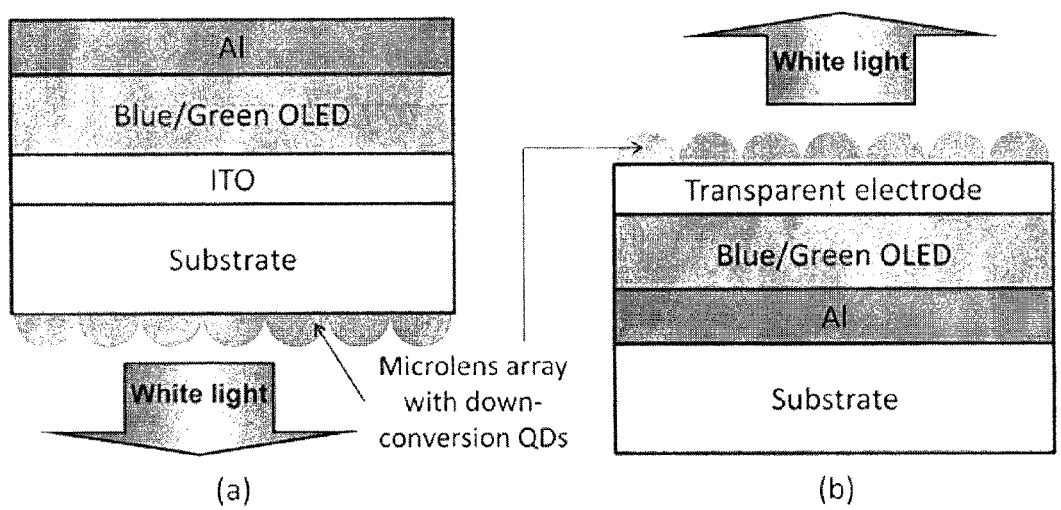
FIG. 2 shows schematic drawings of exemplary hybrid OLED device structures with a QD comprising layer in the form of a microlens array with a) a bottom-emitting geometry and b) a top-emitting geometry, according to embodiments of the invention.

According to embodiments of the invention, one or more QDs, differentiated by size and/or composition are dispersed in a transparent polymer matrix, for example, an optical resin, wherein the QD comprising matrix is employed as a layer through which light generated by electroluminescence from a blue or blue/green OLED layer is transmitted before exiting the hybrid OLED. The QD comprising layer can be continuous or discontinuous and can be in the form of a microlens array residing on the light exiting surface of the OLED, as illustrated in FIG. 2. In one embodiment of the invention, as shown in FIG. 2a, the white light OLED is a bottom-emitting hybrid OLED. In another embodiment of the invention, as shown in FIG. 2b, the white light OLED is a top-emitting hybrid OLED. In this manner, hybrid OLEDs simultaneously achieve high efficacy and high CRI.

Figure 3:
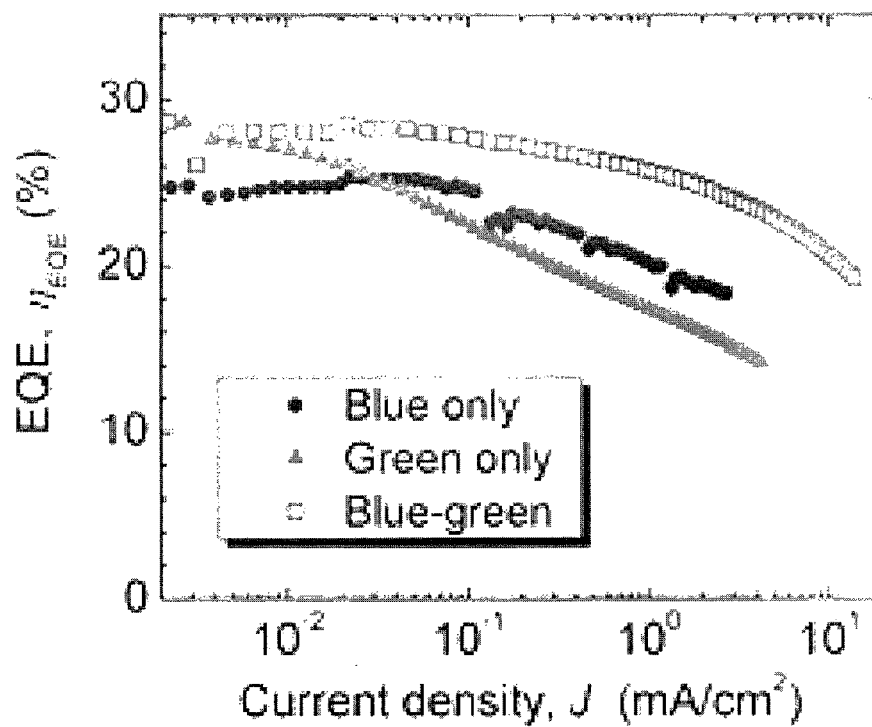
FIG. 3 is a plot of EQE for a blue-green phosphorescent OLED that can be employed in the hybrid OLEDs, according to embodiments of the invention, vs. the EQE of the blue phosphorescent OLED and the green phosphorescent OLED employed separately.

In some embodiments of the invention, blue-green OLEDs include two phosphorescent emitters. The blue-green emitter is a combination of a blue and a green emitter. For example, the deep-blue electro-phosphorescent dye iridium(III) bis(4',6'-difluorophenylpyridinato) tetrakis(1-pyrazolyl)borate (FIr6) can be used with the green phosphorescent dye fac-tris-(phenylpyridine) iridium [Ir(ppy)$_3$]; the chemical structures of which are shown below. The combined emitters display external quantum efficiency (EQE) that is up to 30 percent higher than that of the emission from an OLED device comprising either emitter employed separately, as illustrated in FIG. 3. The luminous power efficiency of 67 lm/W observed for the blue-green OLED in FIG. 3 is not considered optimized and a further increase in device efficiency can be achieved by reducing the sharp decrease in quantum efficiency, a phenomenon known as "roll-off" that occurs at high luminance, by employing a p-i-n device structure that reduces the device operating voltage.

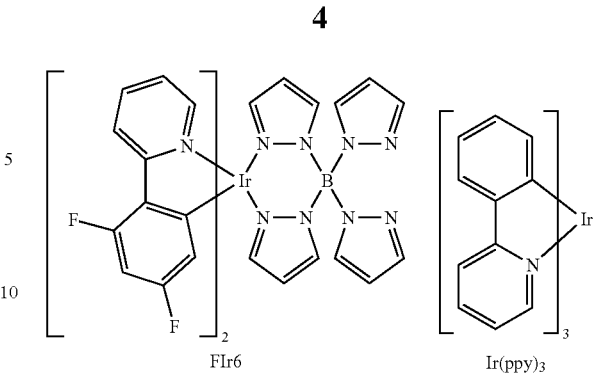

FIr6                                Ir(ppy)$_3$

In embodiments of the invention, the p-i-n device structure can be ITO/hole injection layer (HIL)/hole transporting layer (HTL)/emitting layer (EML)/electron transporting layer (ETL)/electron injection layer (EIL)/cathode. In an embodiment of the invention, the p-type HIL can be, but is not limited to, N,N-diphenyl-NN-bis3-methylphenyl-1,1'-biphenyl-4,4'-diamine (MeO-TPD) doped with 2 mol % tetrafluoro-tetracyanoquinodimethane ($F_4$-TCNQ) and the n-type EIL can be, but is not limited to, tris[3-(3-pyridyl)mesityl]borane (3TPYMB) doped with Cs (with a molar ratio of 1:0.3). The HTL can be, but is not limited to, 1,1-bis-(di-4-tolylaminophenyl)cyclohexane (TAPC) and the ETL can be, but is not limited to, 3TPYMB.

Figure 4:
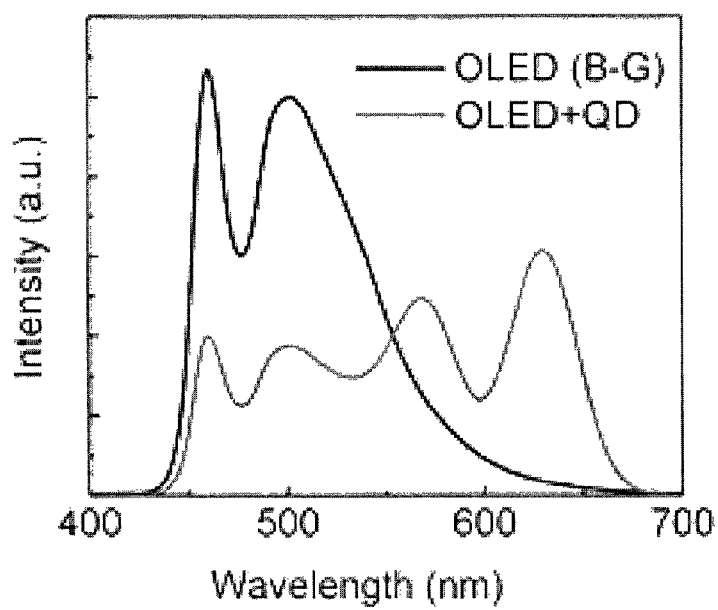
FIG. 4 shows an emission spectrum of the blue-green OLED and the QD down-converted white light (OLED+QD) that is generated by the down-conversion of blue and green light in a hybrid OLED, according to an embodiment of the invention.

In embodiments of the invention, the QDs can be of any composition that provides a down-conversion of higher energy blue or blue-green light from the OLED. In an embodiment of the invention, the QDs comprise a core-shell CdSe—ZnS alloy, where the core is CdSe rich, the shell is ZnS rich, and the diameter of the QD is 5 to 7 nm. In other embodiments of the invention, other quantum dots can be used, such as those disclosed in Qian et al. US Patent Application Publication No. 2012/0138894, which is incorporated herein by reference. As illustrated in FIG. 1a, quantum dots can provide a green, yellow, orange or red color. Combinations of different sized QDs permit the down-conversion of the blue or the blue-green light to a desired set of colors. As shown in FIG. 4, by employing two different down-conversion QDs that display emission peaks at 570 nm and 635 nm, and FWHMs of 40 nm, the blue-green emission spectrum from the OLED is transformed into white light with a calculated CRI of 91 and color temperature of ~3500 K. The low amount of photons with wavelength approaching 700 nm enables high luminous efficiency.

In an embodiment of the invention, a blue OLED emitter, for example, the blue emitter FIr6, is used with green and red or yellow and red fluorescent QDs to generate the broad spectrum white light. In an embodiment of the invention, blue and green OLED emitters, for example, FIr6 and Ir(ppy)$_3$, are used with red fluorescent QDs to generate a broad spectrum white light in the hybrid OLED. As desired, for example, for the optimization of the color temperatures available from the white hybrid OLED, a blue-green OLED emitter can be employed with a plurality of different sized, and, therefore, different color converting QDs. For example, a blue-green OLED emitter can be employed with red and yellow fluorescent QDs, with red and orange fluorescent QDs, or with red, orange and yellow fluorescent QDs.

Figure 5:
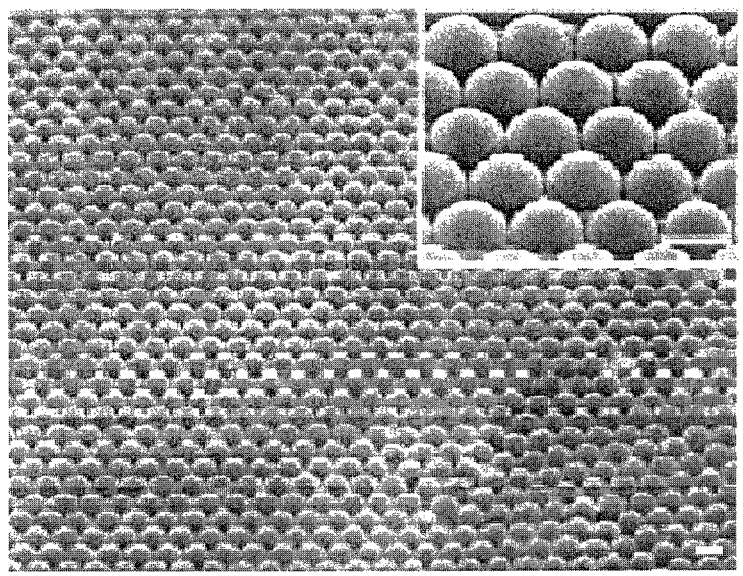
FIG. 5 is an optical microscope image of a portion of a microlens array fabricated by an optical adhesive stamped by a mold of 100 μm hemispheres that can comprise QDs, according to an embodiment of the invention.

In embodiments of the invention, the QD comprising layer resides on the external surface of the hybrid OLED device. In embodiments of the invention, the volume percent of QDs is one to three percent in a transparent resin. The QDs are well dispersed in the resin to avoid aggregates that can modify the emitted color and, when highly aggregated, can adversely affect the transparency of the QD comprising layer. In an embodiment of the invention, the QD layer is a layer that is discontinuous, at lease on its surface plane, comprising a microlens array, in the manner taught by Xue et al. U.S. Pat. No. 8,373,341 or Douglas et al. U.S. Pat. No. 8,040,058, which are incorporated herein by reference in their entirety. The microlenses can be uniform in size or have a variety of sizes. The microlenses can be about 1 to about 200 μm in cross-section. The microlenses can be any shape where the surface of the lens has curvature in at least one plane. The microlenses can be of a single size and can be in a close pack arrangement, for example, as shown in FIG. 5. In an embodiment of the invention, the QD comprising light conversion layer can be a continuous layer and can be below a microlens array on its surface. A microlens array is deposited on the light exiting face of the hybrid OLED device by any deposition technique, including, but not limited to, stamping and ink-jet printing. In one embodiment of the invention, the microlens array results from a soft lithographic stamping technique using a UV curable optical adhesive with well-dispersed QDs. A polydimethylsiloxane (PDMS) stamp patterned by self-assembled monolayers of 100 μm polystyrene microspheres permits deposition of a hexagon close packed array of QD comprising microlenses, as shown in FIG. 5. As taught by Xue et al. U.S. Pat. No. 8,373,341, to achieve optimal out-coupling of light from the top-emitting OLED, as shown in FIG. 2b, the microlens material has a high index of refraction to match the index of the organic materials in the OLED. In one embodiment of the invention, transparent oxide nanoparticles such as, $TiO_x$, ZnO, and $Al_2O_3$ are incorporated into the optical resin to increase the resin's index of refraction.

According to an embodiment of the invention, by incorporation of QDs into a layer comprising a microlens array, a significant improvement in light extraction relative to conventional OLEDs occurs. Microlens arrays can increase light extraction efficiencies by 50 to 70 percent for conventional "bottom-emitting" devices, as shown in FIG. 2a. When microlens arrays are placed on the light exiting surface of a "top-emitting" device, as shown in FIG. 2b, light extraction efficiency that is doubled or greater can be achieved due to direct coupling of the organic waveguiding modes into the microlens array. Based on the efficiency of the blue-green OLED, the hybrid OLEDs, according to embodiments of the invention, can achieve 100 lm/W efficacies using the bottom-emitting structure, as shown in FIG. 2a. Using a top-emitting structure, as shown in FIG. 2b with a fully optimized blue-green OLED, the hybrid OLEDs, according to embodiments of the invention, can achieve efficiencies in the range of 120-150 lm/W.

All patents and patent applications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

I claim:

1. A hybrid organic light emitting diode (OLED) device, comprising:
    an organic light emitting diode comprising an electroluminescent layer comprising a blue emitting organic emitter or a combination of a green emitting organic emitter with the blue emitting organic emitter within the organic tight emitting diode; and
    a conversion layer comprising a plurality of photoluminescent quantum dots (QDs) dispersed in a transparent polymer matrix residing on a light exiting face of a transparent electrode or a transparent substrate of the organic light emitting diode, wherein the QDs down-convert a portion of the blue and green light to one or more higher wavelengths of visible light such that the combination of wavelengths exiting the device provides a white light and wherein the conversion layer consists of a plurality of microlenses.

2. The hybrid OLED device of claim 1, wherein the transparent polymer matrix is an optical resin.

3. The hybrid OLED device of claim 2, wherein the optical resin further includes transparent oxide nanoparticles.

4. The hybrid OLED device of claim 3, wherein the transparent oxide is $TiO_x$, ZnO, or $Al_2O_3$.

5. The hybrid OLED device of claim 1, wherein the photoluminescent QDs differ in size.

6. The hybrid OLED device of claim 1, wherein the photoluminescent QDs comprise 1 to 3 percent of the conversion layer.

7. The hybrid OLED device of claim 1, wherein the quantum dots photoluminesce with a red, orange, or yellow color or any combination thereof.

8. The hybrid OLED device of claim 1, wherein the QDs consist of a CdSe—ZnS alloy with a CdSe rich core and a ZnS rich shell, and wherein the QDs have a diameter of 5 to 7 nm.

9. The hybrid OLED device of claim 1, wherein the microlenses are 1 to 200 μm in cross-section.

10. The hybrid OLED device of claim 1, wherein the blue emitting organic phosphor is FIr6 and the green emitting organic phosphor is $Ir(ppy)_3$.

11. The hybrid OLED device of claim 1, wherein the organic light emitting diode has a p-i-n device architecture.

* * * * *